(12) United States Patent
Späth et al.

(10) Patent No.: US 6,947,460 B2
(45) Date of Patent: Sep. 20, 2005

(54) OPTICALLY PUMPABLE SURFACE-EMITTING SEMICONDUCTOR LASER DEVICE

(75) Inventors: Werner Späth, Holzkirchen (DE); Johann Luft, Wolfsegg (DE); Stephan Lutgen, Regensburg (DE); Norbert Linder, Wenzenbach (DE); Tony Albrecht, Bad Abbach (DE); Ulrich Steegmüller, Regensburg (DE)

(73) Assignee: Osram GmbH, Munich (DE)

( * ) Notice: Subject to any disclaimer, the term of this patent is extended or adjusted under 35 U.S.C. 154(b) by 5 days.

(21) Appl. No.: 10/402,814

(22) Filed: Mar. 28, 2003

(65) Prior Publication Data

US 2004/0022286 A1 Feb. 5, 2004

(30) Foreign Application Priority Data

Mar. 28, 2002 (DE) .......................................... 102 14 120

(51) Int. Cl.[7] .......................... H01S 5/00; H01S 3/091; H01S 3/092; H01S 3/08
(52) U.S. Cl. .............................. 372/43; 372/96; 372/70
(58) Field of Search ............................. 372/43, 96, 50, 372/70–75, 69, 93

(56) References Cited

U.S. PATENT DOCUMENTS

| | | | |
|---|---|---|---|
| 5,748,653 A | | 5/1998 | Parker et al. |
| 5,796,771 A | * | 8/1998 | DenBaars et al. ............. 372/75 |
| 5,991,318 A | * | 11/1999 | Caprara et al. ................ 372/22 |
| 6,285,704 B1 | | 9/2001 | Kullander-Sjoberg et al. |
| 6,327,293 B1 | * | 12/2001 | Salokatve et al. ............. 372/96 |
| 6,347,108 B2 | * | 2/2002 | Jiang et al. ..................... 372/50 |
| 6,424,669 B1 | * | 7/2002 | Jiang et al. ..................... 372/50 |
| 6,535,537 B1 | * | 3/2003 | Kinoshita ..................... 372/50 |
| 6,553,048 B2 | * | 4/2003 | Jiang et al. ..................... 372/50 |
| 6,580,741 B2 | * | 6/2003 | Jiang et al. ..................... 372/50 |
| 6,711,203 B1 | * | 3/2004 | Garnache et al. ............. 372/92 |
| 6,714,574 B2 | * | 3/2004 | Clayton et al. ............... 372/50 |
| 6,735,234 B1 | * | 5/2004 | Paschotta et al. ............. 372/75 |
| 2002/0001328 A1 | | 1/2002 | Albrecht et al. |
| 2002/0075935 A1 | * | 6/2002 | Clayton ........................ 372/75 |

FOREIGN PATENT DOCUMENTS

| | | |
|---|---|---|
| DE | 100 26 734 A1 | 12/2001 |
| WO | 01/13481 A1 | 2/2001 |

OTHER PUBLICATIONS

Gerhold et al., Mar. 1998, IEEE Journal of Quantum Electronics, vol. 34, No. 3.*

Shire, D.B. et al.: "Gain Controlled Vertical Cavity Surface Emitting Lasers Coupled with Intracavity In–Plane Lasers", American Institute of Physics, Appl. Phys. Lett. 66 (14), Apr. 3, 1995, pp. 1717–1719.

* cited by examiner

Primary Examiner—Hoang V. Nguyen
Assistant Examiner—Hung Tran Vy
(74) Attorney, Agent, or Firm—Laurence A. Greenberg; Werner H. Stemer; Ralph E. Locher

(57) ABSTRACT

In an optically pumpable surface-emitting semiconductor laser device with a vertical emitter with a radiation-generating active layer, at least one modulation radiation source for modulating the output power of the surface-emitting semiconductor device is provided. The modulation radiation source is formed by an edge-emitting semiconductor structure with an active layer, and which is disposed such that during operation it radiates into the radiation-generating active layer of the vertical emitter. This produces an easily modulatable surface-emitting laser source of high power and high beam quality. A pumping radiation source for optically pumping the active layer of the vertical emitter is preferably provided in the semiconductor laser device.

42 Claims, 5 Drawing Sheets

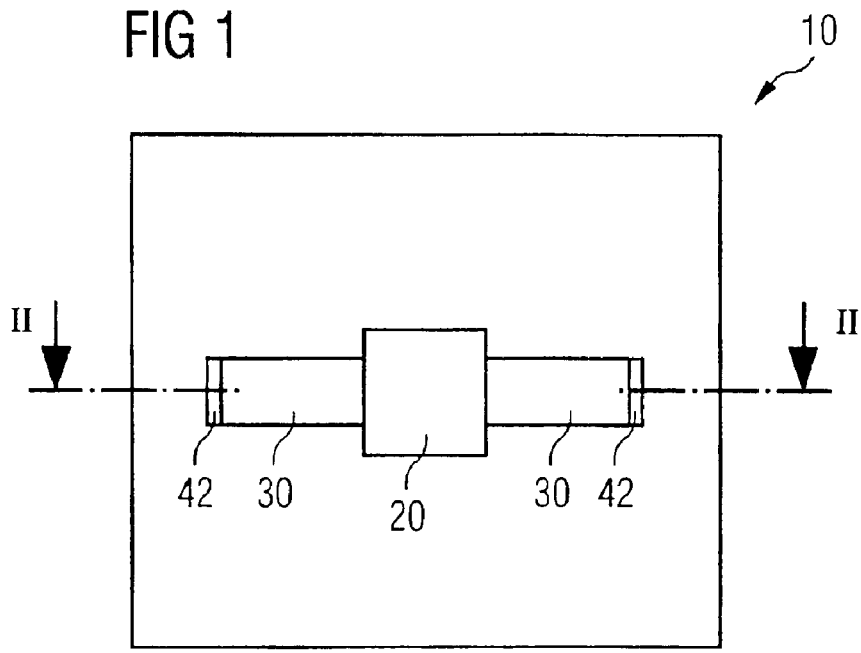
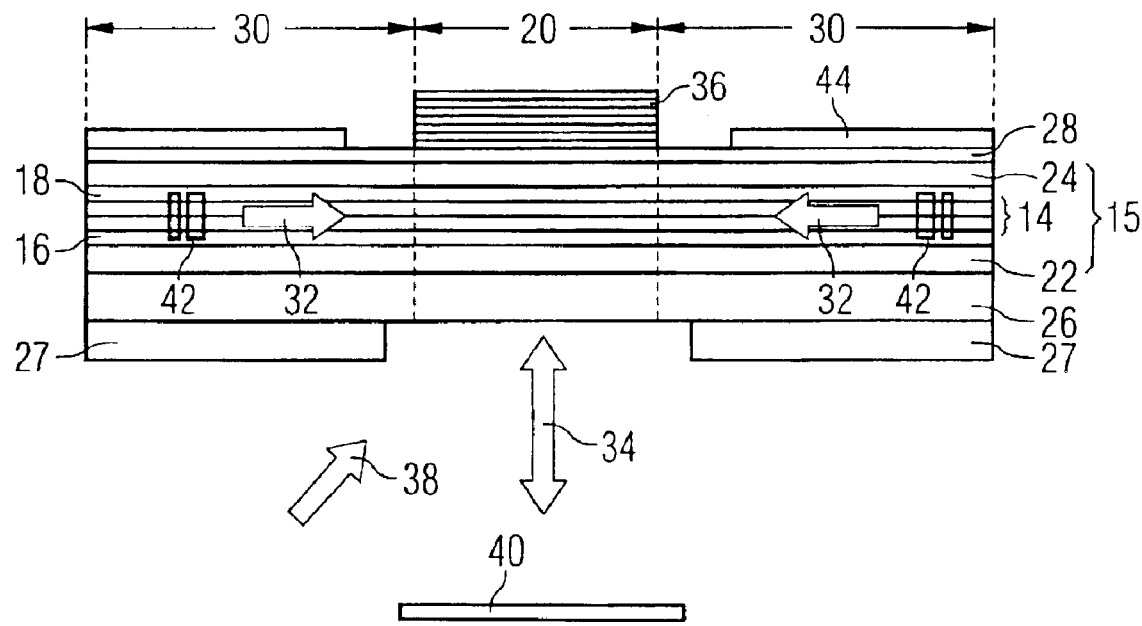

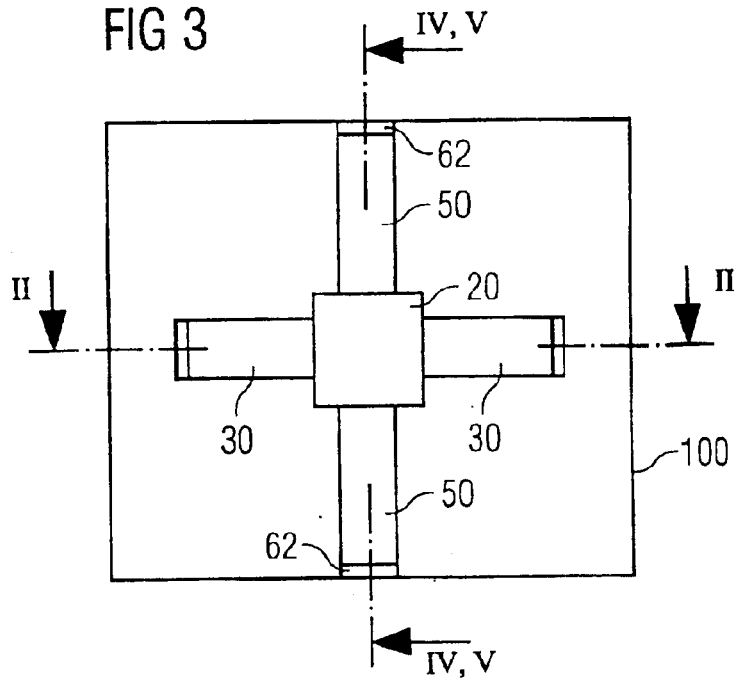
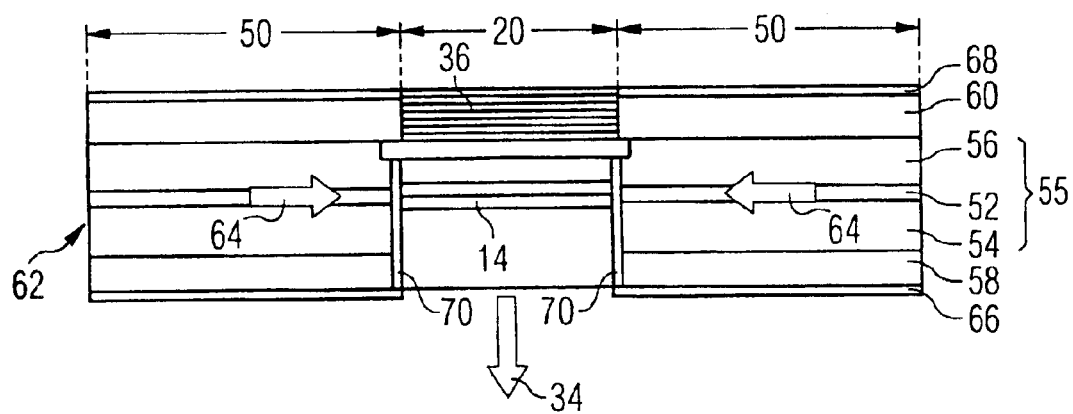

OPTICALLY PUMPABLE SURFACE-EMITTING SEMICONDUCTOR LASER DEVICE

BACKGROUND OF THE INVENTION

Field of the Invention

The invention relates to a surface-emitting semiconductor laser device with an optically pumpable vertical emitter having a radiation-generating active layer.

An optically pumped surface-emitting semiconductor laser device is disclosed in U.S. Pat. No. 5,991,318 for example, which describes an optically pumped vertical resonator semiconductor laser with a monolithic surface-emitting semiconductor layer structure. In the device, the optical pumping radiation, whose wavelength is shorter than that of the generated laser radiation, is generated by an edge-emitting semiconductor laser diode disposed externally such that the pumping radiation is radiated obliquely from the front into an amplifying region of the surface-emitting semiconductor layer structure.

In such a configuration, the pumping light source has to be oriented very precisely to the surface-emitting semiconductor layer structure. In addition, optical devices for beam focusing are generally necessary.

In Published, Non-Prosecuted German Patent Application DE 100 26 734 A1, corresponding to Published, Non-Prosecuted U.S. patent application Ser. No. 2002001328 A1, it is proposed in this respect, in the case of an optically pumped surface-emitting semiconductor laser device, to grow the radiation-generating quantum well structure and the edge-emitting semiconductor structure epitaxially on a common substrate. The layer thicknesses of the individual semiconductor layers can be set very precisely during the epitaxy, so that a high positioning accuracy of the edge-emitting semiconductor structure with respect to the radiation-generating quantum well structure is advantageously achieved.

In the case of the semiconductor laser device described in Published, Non-Prosecuted German Patent Application DE 100 26 734 A1, the emitted radiation can be modulated for example by the pumping laser through modulation of the pumping current or by a short-circuiting circuit of the surface-emitting semiconductor laser layer sequence. However, this type of modulation can lead to difficulties particularly in high-power lasers with an optical pumping power in the watts range, on account of the comparatively high electric pumping current, which is typically in the region of a few amperes. Such difficulties may occur principally in the case of fast modulation, as is necessary in the case of laser projection, for example.

SUMMARY OF THE INVENTION

It is accordingly an object of the invention to provide an optically pumpable surface-emitting semiconductor laser device that overcomes the above-mentioned disadvantages of the prior art devices of this general type, which allows fast modulation of the output power to be made possible.

With the foregoing and other objects in view there is provided, in accordance with the invention, a surface-emitting semiconductor laser device. The semiconductor laser device contains an optically pumpable vertical emitter having a radiation-generating layer, and at least one modulation radiation source for modulating an output power of the surface-emitting semiconductor laser device. The modulation radiation source has an edge-emitting semiconductor structure with a radiation-generating active layer. The modulation radiation source is disposed such that during operation the modulation radiation source emitting radiation coupled into the radiation-generating active layer of the optically pumpable vertical emitter.

According to the invention, in the case of a surface-emitting semiconductor laser device of the type mentioned in the introduction, an optically pumpable vertical emitter is provided and at least one modulation radiation source for modulating the output power of the surface-emitting semiconductor device is provided, which is formed by an edge-emitting semiconductor structure with an active layer, and which is disposed such that during operation it radiates into the radiation-generating active layer of the vertical emitter.

The invention is thus based on the concept of reducing in a controlled manner, and completely quenching in the extreme case, the charge carrier inversion in the active layer of the vertical emitter by use of radiation of a modulation radiation source. The reduced population inversion leads to a correspondingly reduced output power of the vertical emitter. In this case, the reduction of the population inversion requires only a comparatively low modulation power and hence only a small and rapidly changeable modulation current.

In a preferred embodiment of the semiconductor laser device, it is provided that the active layer of the edge-emitting semiconductor structure of the modulation radiation source and the active layer of the vertical emitter have the same structure and/or the same construction and/or are formed from the same materials. This allows joint production of vertical emitter and modulation radiation source and at the same time ensures that the modulation radiation can couple effectively to the population inversion of the vertical emitter since its energy precisely corresponds to the energy gap in the active layer of the vertical emitter. Particularly preferably, the two active layers are identical.

In this case, it is advantageous that during operation the active layer of the edge-emitting semiconductor structure of the modulation radiation source radiates with the same wavelength as the active layer of the vertical emitter.

In this connection, in a semiconductor laser device according to the invention, it is advantageously provided that the edge-emitting semiconductor structure of the modulation radiation source and the vertical emitter are grown epitaxially on a common substrate. The epitaxy allows a precise setting of the layer thicknesses of the individual semiconductor layers, thus achieving a high positioning accuracy of the edge-emitting semiconductor structure of the modulation radiation source with respect to the active layer of the vertical emitter.

In particular, the active layer of the edge-emitting semiconductor structure of the modulation radiation source and the active layer of the vertical emitter may advantageously lie next to one another and at the same level, so that during operation the modulation radiation source radiates laterally into the active layer of the vertical emitter.

In a refinement of the invention, two or more modulation radiation sources are disposed around the vertical emitter in order to radiate into the active layer of the vertical emitter during operation, so that the active layer of the vertical emitter can be modulated rapidly and homogeneously over its entire lateral cross section.

In a preferred refinement of the semiconductor laser device according to the invention, an increased modulation efficiency can be achieved by generating laser radiation as modulation radiation in that in each case two modulation radiation sources disposed on mutually opposite sides of the vertical emitter together form a laser structure for modulating the output power of the semiconductor device. To that end, by way of example, end surfaces of the modulation radiation sources are formed as mirror surfaces which are produced for example by cleaving or etching, are provided with a passivation layer and/or are mirror-coated in highly reflective fashion. During operation, the respective opposite modulation radiation sources are then coupled to form a single coherently oscillating laser.

In an expedient refinement of the invention, it is provided that the active layer of the edge-emitting semiconductor structure of the modulation radiation source is embedded between a first and a second waveguide layer which, for their part, may be embedded between a first and a second cladding layer.

In the case of the invention, the pumping radiation source may be provided as an external radiation source. However, the pumping radiation source is preferably likewise disposed, for example grown epitaxially, on the substrate of the vertical emitter. The optically pumped semiconductor device thus formed is distinguished by a particularly compact monolithic construction.

It is expedient in this case if an active layer of the edge-emitting semiconductor structure of the pumping radiation source and the active layer of the vertical emitter lie next to one another and at the same level, so that during operation the pumping radiation source radiates laterally into the active layer of the vertical emitter.

In a preferred embodiment of the semiconductor laser device according to the invention, the edge-emitting semiconductor structure of the pumping radiation source has an active layer which is different from the active layer of the vertical emitter, in particular the active layer of the pumping radiation source emitting at a shorter wavelength than the active layer of the vertical emitter.

In order that the active layer of the vertical emitter is pumped over its entire lateral cross section in a short time and homogeneously, it is preferably provided that two or more pumping radiation sources are disposed around the vertical emitter in order to radiate into the active layer of the vertical emitter during operation.

An increased pumping efficiency is advantageously achieved by virtue of the fact that in each case two pumping radiation sources disposed on mutually opposite sides of the vertical emitter together form a laser structure for optical pumping by use of laser radiation.

In an advantageous development of the semiconductor laser device according to the invention, it is provided that the pumping radiation source has at least one ring laser, the active layer of the vertical emitter preferably being disposed within the resonator of the ring laser. In particular, the resonator of the ring laser may be formed by an annularly closed waveguide.

In a further advantageous development, the edge-emitting semiconductor structure of the pumping radiation source has an active layer embedded between a first and a second waveguide layer which, for its part, may be embedded between a first and a second cladding layer.

Instead of the active layer of the pumping radiation source and the active layer of the vertical emitter being disposed next to one another and at the same level, the invention may also provide for the active layer of the vertical emitter and the pumping radiation source to be disposed one above the other, and for the active layer of the vertical emitter to be optically coupled to the edge-emitting semiconductor structure of the pumping radiation source, so that during operation radiation of the pumping radiation source is guided into the active layer of the vertical emitter.

This can be achieved for example by virtue of the fact that the edge-emitting semiconductor structure of the pumping radiation source has an active layer embedded between a first and a second waveguide layer, and the active layer of the vertical emitter is applied on one of the waveguide layers, so that at least part of the radiation generated in the edge-emitting semiconductor structure of the pumping radiation source is guided into the active layer of the vertical emitter.

In all the embodiments, in order to reduce radiation losses, the thickness of the common growth substrate can advantageously be reduced to less than 100 $\mu$m, or the substrate can be completely removed, after the epitaxy steps. If the substrate is not completely removed, it expediently contains a material that is transmissive for the radiation generated in the vertical emitter.

A resonator mirror layer, in particular a distributed Bragg reflector, is preferably applied on that side of the vertical emitter that is remote from the substrate.

A second internal resonator mirror formed by a second resonator mirror layer disposed between the substrate and the active layer of the vertical emitter may be provided as the second resonator mirror.

As an alternative, a second resonator mirror of the resonator of the vertical emitter may be formed by an external mirror. This alternative is advantageous particularly if an element for frequency conversion, for example a frequency doubler, is disposed in the resonator of the vertical emitter. For this purpose, an optically nonlinear crystal for frequency conversion may be disposed in the resonator. Since the output power of the frequency-converted radiation depends nonlinearly on the output power of the vertical emitter, particularly low modulation currents of the modulation radiation source suffice for the modulation in this case.

The invention is particularly suitable for semiconductor laser devices which are configured for an output power of above 100 mW, preferably of above 200 mW, particularly preferably of above 500 mW, the modulation radiation source enabling fast modulation of the output power of the semiconductor laser device.

The vertical emitter and/or modulation radiation source and/or the pumping radiation source may advantageously be formed on the basis of InGaAlAs, InGaN, InGaAsP or InGaAlP.

Other features which are considered as characteristic for the invention are set forth in the appended claims.

Although the invention is illustrated and described herein as embodied in an optically pumpable surface-emitting semiconductor laser device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of an optically pumped surface-emitting semiconductor laser device according to one exemplary embodiment of the invention;

FIG. 2 is a diagrammatic, sectional view of the semiconductor laser device of FIG. 1 or FIG. 3, taken along the line II—II shown in FIG. 1 or FIG. 3;

FIG. 3 is a diagrammatic, plan view of the optically pumped surface-emitting semiconductor laser device according to a second exemplary embodiment of the invention;

FIG. 4 is a diagrammatic, sectional view of the semiconductor laser device of FIG. 3, taken along the line IV—IV shown in FIG. 3;

DESCRIPTION OF THE PREFERRED EMBODIMENTS

Figure 5:
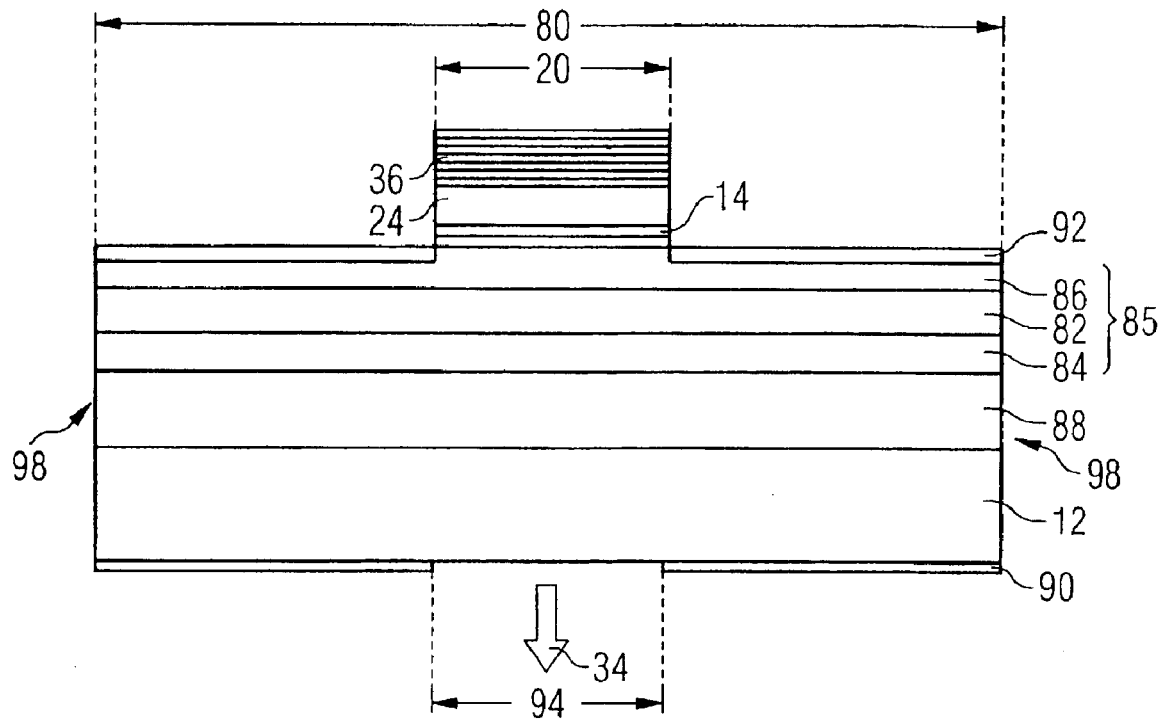
FIG. 5 is a diagrammatic, sectional view of an alternative configuration of the semiconductor laser device of FIG. 3, taken along the line V—V shown in FIG. 3.

Referring now to the figures of the drawing in detail and first, particularly, to FIG. 1 thereof, there is shown a plan view of an optically pumped surface-emitting semiconductor laser device 10 according to one exemplary embodiment of the invention. The vertical construction is illustrated in section along the line II—II shown in FIG. 2. By way of example, the semiconductor laser device 10 is configured for emission at 1030 nm.

With reference to FIGS. 1 and 2, a rear-side-emitting vertical emitter 20 with a square cross section has an active radiation-emitting layer 14 with a quantum well structure. In the exemplary embodiment, the vertical emitter 20 contains a double quantum well structure containing undoped InGaAs wells whose width is chosen so as to result precisely in the emission sought at 1030 nm.

The active layer 14 is embedded between a first undoped $Al_zGa_{1-z}As$ layer 16 and a second undoped $Al_zGa_{1-z}As$ layer 18, which, as described further below in connection with strip lasers 30, serve as waveguide layers. The waveguide layers 16 and 18 are delimited by an n-doped $Al_yGa_{1-y}As$ confinement layer 22 and a p-doped $Al_yGa_{1-y}As$ confinement layer 24. For their part, the confinement layers 22, 24 are embedded between a highly doped n-type contact layer 26 made of $Al_xGa_{1-x}As$ and a highly doped p-type contact layer 28 having a thickness of 0.1 to 0.2 µm made of $Al_xGa_{1-x}As$. In this case, the relationship x<y and y>z applies to the aluminum content of the layers. In order to minimize absorption losses through the highly doped p-type contact layer 28 in the vertical emitter 20, the layer is preferably disposed at a wave node of the standing wave field.

In the exemplary embodiment, the vertical emitter 20 is pumped externally by a non-illustrated pumping radiation source whose pumping radiation (arrow 38) generates a population inversion in the active layer 14 of the vertical emitter 20 in a known manner.

A resonator mirror 36 disposed on a top side of the vertical emitter 20 and an external resonator mirror 40 (only shown diagrammatically) form the resonator of the vertical emitter 20 in which the vertical radiation (arrow 34) propagates. The external resonator mirror 40 may, for example, also be coupled to the internal resonator mirror 36 via a partly transmissive deflection mirror, as explained further below in the description of FIG. 6.

In the exemplary embodiment, the resonator mirror 36 is formed as an end mirror in the form of a distributed Bragg mirror (DBR, Distributed Bragg Reflector) with, for example, 30 periods made of undoped $Al_{0.1}Ga_{0.9}Al$ and $Al_{0.9}Ga_{0.1}Al$ with a reflectivity of >0.99. The external mirror may be partly transmissive as a coupling-out mirror.

Two strip lasers 30 are disposed beside the vertical emitter 20 and adjoining the latter on two sides (FIG. 1), which strip lasers function as modulation radiation sources for the vertical emitter 20. The active zone 14 of the strip lasers 30 is identical to the active zone 14 of the vertical emitter 20 and, during the growth process, is applied simultaneously with the active zone, as a uniform layer sequence, to a growth substrate that has already been removed in FIG. 2.

Through mirror structures 42 and the waveguide layers 16 and 18, the strip lasers 30 form edge-emitting semiconductor structures that radiate into the active layer 14 of the vertical emitter 20 (arrow 32).

Since the strip lasers 30 have the same active layer sequence as the vertical emitter 20, they emit at the same wavelength. Consequently, as a result of the modulation radiation 32 being radiated in, the charge carrier inversion in the active layer 14 of the vertical emitter can be quenched, that is to say reduced down to small values or completely. The quenched population inversion leads to a correspondingly reduced output power of the vertical emitter 20. In this case, the quenching of the population inversion does not require a high output power of the modulation radiation source, that is to say also requires only a small modulation current.

Overall, the combination of the modulation radiation sources 30 and the vertical emitter 20 yields a compact high-power surface-emitting laser source that combines a high beam quality with easy modulatability.

In the exemplary embodiment of FIG. 2, the power supply for the edge-emitting strip lasers 30 is effected, from the p-type side, via a p-type contact 44 applied on the laser strips 30 and, from the n-type side, via an n-type contact 27 provided on an n-type contact layer 26 after an etching-free process. As an alternative, in an embodiment in which the semiconductor laser device 10 is mounted with the p-type side downward, the n-type contact connection may be effected on a thinned n-type substrate, so that a highly doped n-type contact layer introduced into the layer structure is not necessary.

In order to reduce radiation losses, the growth substrate is thinned to less than 100 µm, for example, or completely removed after the epitaxy steps. FIGS. 2 and 4 show semiconductor laser devices with the substrate having been completely removed, and FIG. 5 shows an exemplary embodiment in which the substrate 12 has been thinned to about 80 µm.

A further exemplary embodiment of the invention, in which the pumping radiation sources are integrated monolithically with the vertical emitter on a substrate, is explained below in connection with FIGS. 3 and 4. FIG. 3 again shows the plan view, and FIG. 4 shows a sectional view along the line IV—IV shown in FIG. 3.

The plan view of FIG. 3 shows an optically pumped surface-emitting semiconductor laser device that, like the semiconductor laser device of FIG. 1, may be configured for emission at 1030 nm. In this case, the two strip lasers 30 are disposed on both sides of a rear-side-emitting vertical emitter 20 with a square cross section. In this respect, the construction of the exemplary embodiment in FIG. 3 along the sectional view of the line II—II corresponds to that in the exemplary embodiment explained in connection with FIG. 1.

In addition, in the exemplary embodiment of FIG. 3, two pumping radiation sources 50 are disposed on both sides of the vertical emitter 20, but in a direction perpendicular to the axis of the modulation radiation source 30. As can be seen in FIG. 4, the pumping radiation sources 50 are formed by edge-emitting semiconductor laser structures, for example by large optical cavity-single quantum well (LOC-SQW) laser structures—known per se—for emission at about 1000 nm.

In the exemplary embodiment, the LOC-SQW structure contains a first cladding layer 58 made of n-GaAl$_{0.65}$As, a first waveguide layer 54 made of n-GaAl$_{0.1}$As, an active layer 52 containing an undoped InGaAs-SQW, a second waveguide layer 56 made of p-GaAl$_{0.1}$As and a second cladding layer 60 made of p-GaAl$_{0.65}$As.

By way of example, a p$^+$-doped GaAs layer may be applied as a covering layer on the second cladding layer 60. On the free surface of the covering layer, an electrically insulating mask layer 100 is applied, for example a silicon nitride, an aluminum oxide or a silicon oxide layer, whose recesses define current injection paths of the pumping radiation sources 50 (also see FIGS. 3, 7, 8A and 8B). A p-type contact layer 68, e.g. known contact metallization, is applied on the mask layer 100 and in the cutouts thereof for the current injection paths, on the covering layer. An n-type contact 66 is provided on an underside of the first cladding layer 58.

During the operation of the semiconductor laser device, pumping radiation (arrow 64) is generated in those regions of the edge-emitting semiconductor structures of the pumping radiation sources which are defined by the n-type contacts 66 and the p-type contacts 68 and is coupled into the active layer 14 of the vertical emitter 20. To that end, in the exemplary embodiment, the active layers 52 of the pumping radiation sources 50 are disposed at the same level as the active layer 14 of the vertical emitter, so that they radiate directly into the active layer 14.

End mirrors 62 that run perpendicularly are disposed near the outer edge of the pumping radiation sources 50. They may be produced for example after the growth of the pumping radiation sources 50 by the etching of corresponding trenches and the subsequent filling thereof with highly reflective material, or they may be produced in a known manner by cleaving the wafer along crystal planes. These are then necessarily not disposed in the chip, but rather are formed by the cleaved chip side faces. This alternative is realized in the exemplary embodiment shown in FIG. 4.

Given sufficient back reflection at an interface 70 between the pumping radiation source 50 and the vertical emitter 20 and a suitable position of the end mirrors 62, laser radiation is generated in the pumping radiation sources 50, which leads to an increased pumping efficiency.

In the exemplary embodiment, the end surfaces 62 are disposed with respect to one another in such a way that they form a laser resonator for the mutually opposite pumping radiation sources 50. Once the active layer of the vertical emitter 20 has been pumped to such an extent that it is sufficiently transparent for the pumping radiation, the two opposite pumping radiation sources 50 are coupled to form a coherently oscillating laser. Given optimal mirror-coating of the end mirrors or end surfaces 62, the entire optical power generated by the pumping lasers 50 is then available as pumping power, with the exception of losses at the interfaces 70.

During the production of the semiconductor laser device shown in FIG. 3, two separate epitaxy steps are carried out. First, in a first epitaxy step, the vertical emitter 20 and the strip lasers 30 with the semiconductor layers specified are grown on a common substrate. Then, in the regions in which the pumping radiation sources 50 are to be grown, the epitaxial layers are etched away down to the substrate, and the epitaxial layers of the pumping radiation sources 50 are grown in a second epitaxy step. Afterward, the region of the vertical emitter 20 and the region of the pumping radiation sources 50 that has been deposited by the second epitaxy step is protected by an etching mask, and the region of the strip lasers 30 is etched away as far as the highly doped p-type contact layer. Finally, the p-type metallization for the modulation strip lasers 30 is applied on these uncovered strip-shaped regions that open in the region of the vertical emitter 20. Lastly, in order to reduce radiation losses, as described above, the growth substrate is thinned or completely removed.

FIG. 5 shows an alternative configuration of the pumping radiation source for the optically pumped semiconductor laser device shown in FIG. 3, illustrated along the line V—V shown in FIG. 3.

In the exemplary embodiment according to FIG. 5, the pumping radiation source 80 is not disposed at the same level as the vertical emitter 20, but rather below the latter. As shown in FIG. 5, on a substrate 12, there is applied a whole-area buffer layer 88 and an edge-emitting semiconductor laser structure 85 in which an active layer 82 is disposed between a first waveguide layer 84 and a second waveguide layer 86. In the exemplary embodiment cleavage faces 98 of the semiconductor body serve as end mirrors of the edge-emitting semiconductor laser structure 85.

The vertical emitter 20 is grown in the center of the substrate 12 on the second waveguide layer 86 with the active layer 14, a confinement layer 24 provided thereon and the Bragg mirror layer sequence 36.

In this case, the active layer 82 of the pumping radiation source 80 is optically coupled to the active layer 14 of the vertical emitter 20 via a waveguide layer 86, which guides part of the radiation generated in the pumping radiation source 80 toward the active layer 14. In order to improve the coupling-in, the active layer 82 is disposed asymmetrically in the waveguide formed by the two waveguide layers 84 and 86. As an alternative or in addition, for the same purpose, the refractive index of the second waveguide layer 86 may be higher than that of the first waveguide layer 84 and/or the second waveguide layer 86 may gradually rise toward the active layer 14.

In the region around the vertical emitter 20, the electrically insulating mask layer 100 is applied to the second waveguide layer 86 or, if appropriate, to a highly doped covering layer applied on the latter, which mask layer has recesses for current injection paths for the edge-emitting structure 85 (FIG. 3). A first contact layer 92 is situated on the electrically insulating mask layer 100 and in the recesses thereof on the second waveguide layer 86 or on the covering layer and a second contact layer 90 with an exit window 94 for the laser beam (arrow 34) is provided on that side of the substrate 12 opposite to the contact layer 92. In this case, the substrate 12 was thinned to a thickness of about 80 μm after the growth of the modulation radiation sources 30.

Figure 6:
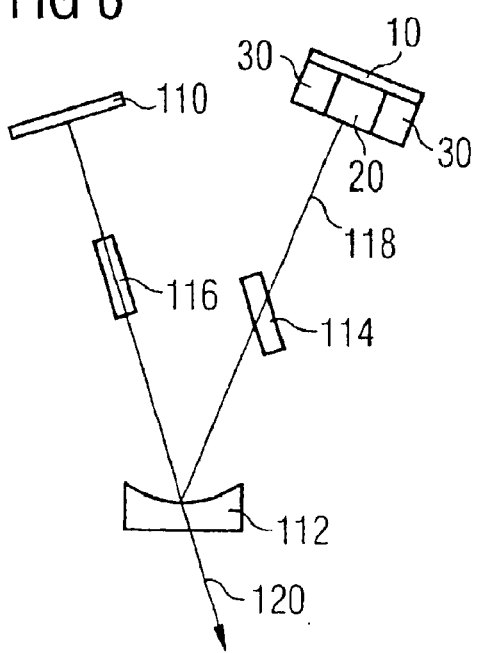
FIG. 6 is an illustration of a semiconductor laser device according to the invention with an external resonator.

FIG. 6 shows the operation of a semiconductor laser device according to the invention with an external resonator mirror 110. In this case, the laser radiation emitted by the vertical emitter 20 passes through a frequency-selective element 114 and is guided via a deflection mirror 112 through a nonlinear optical crystal 116 and onto the external resonator mirror 110. In this case, in the nonlinear optical crystal 116, part of the laser radiation is converted into radiation of double the frequency in a known manner. In this case, the reflectivity of the deflection mirror 112 varies such that the frequency-doubled radiation 120 is coupled out at the deflection mirror 112. The frequency-selective element 114 ensures that only the fundamental frequency passes back to the vertical emitter 20.

Since the output power of the frequency-doubled radiation 120 depends nonlinearly on the output power of the vertical emitter 20 owing to the frequency conversion, particularly low modulation currents of the modulation lasers 30 suffice for the modulation in this case.

Figure 7:
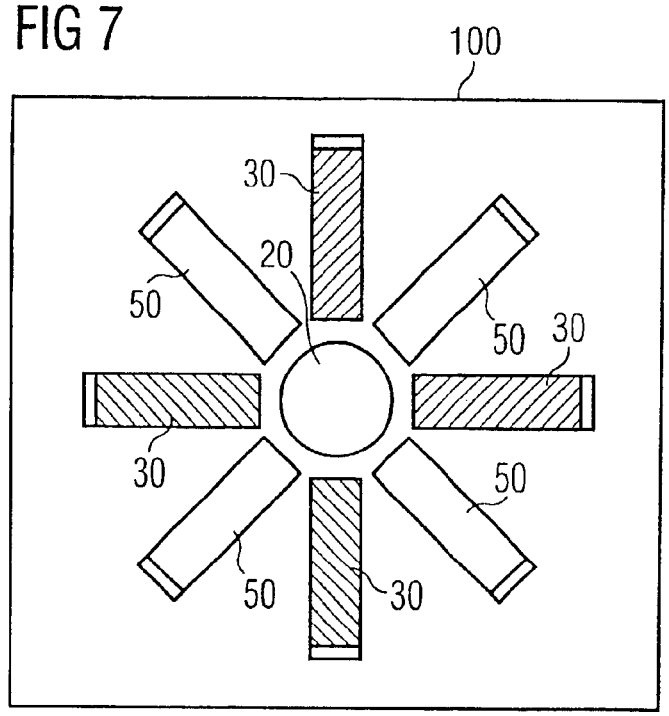
FIG. 7 is a diagrammatic, plan view of the optically pumped surface-emitting semiconductor laser device according to a third exemplary embodiment of the invention.

FIG. 7 shows a further exemplary embodiment of the semiconductor laser device according to the invention, in which four modulation radiation sources 30 and four pumping radiation sources 50 are disposed alternately in star-shaped fashion around the vertical emitter 20, in order to deposit both the pumping radiation and the modulation radiation homogeneously in the active layer of the vertical emitter.

Figure 8A:
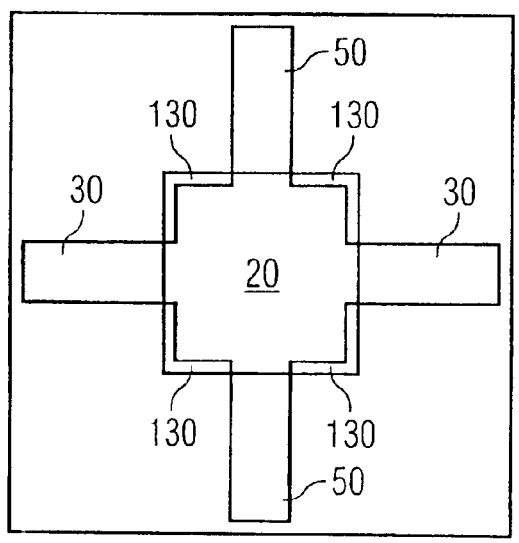
FIG. 8A is a diagrammatic, plan view of the semiconductor laser device with absorber layers according to a further exemplary embodiment of the invention.
Figure 8B:
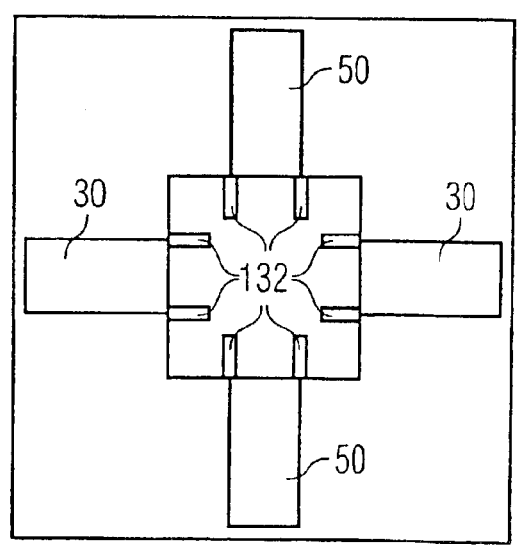
FIG. 8B is a diagrammatic, plan view of the semiconductor laser device with the absorber layers according to a still further exemplary embodiment of the invention.

As shown in FIGS. 8A and 8B, in all the exemplary embodiments, absorber layers 130 or 132 may additionally be disposed in the edge region and/or in etching structures of the vertical emitter 20, which absorber layers suppress interfering transverse modes, that is to say modes which run parallel to the substrate.

Figure 9:
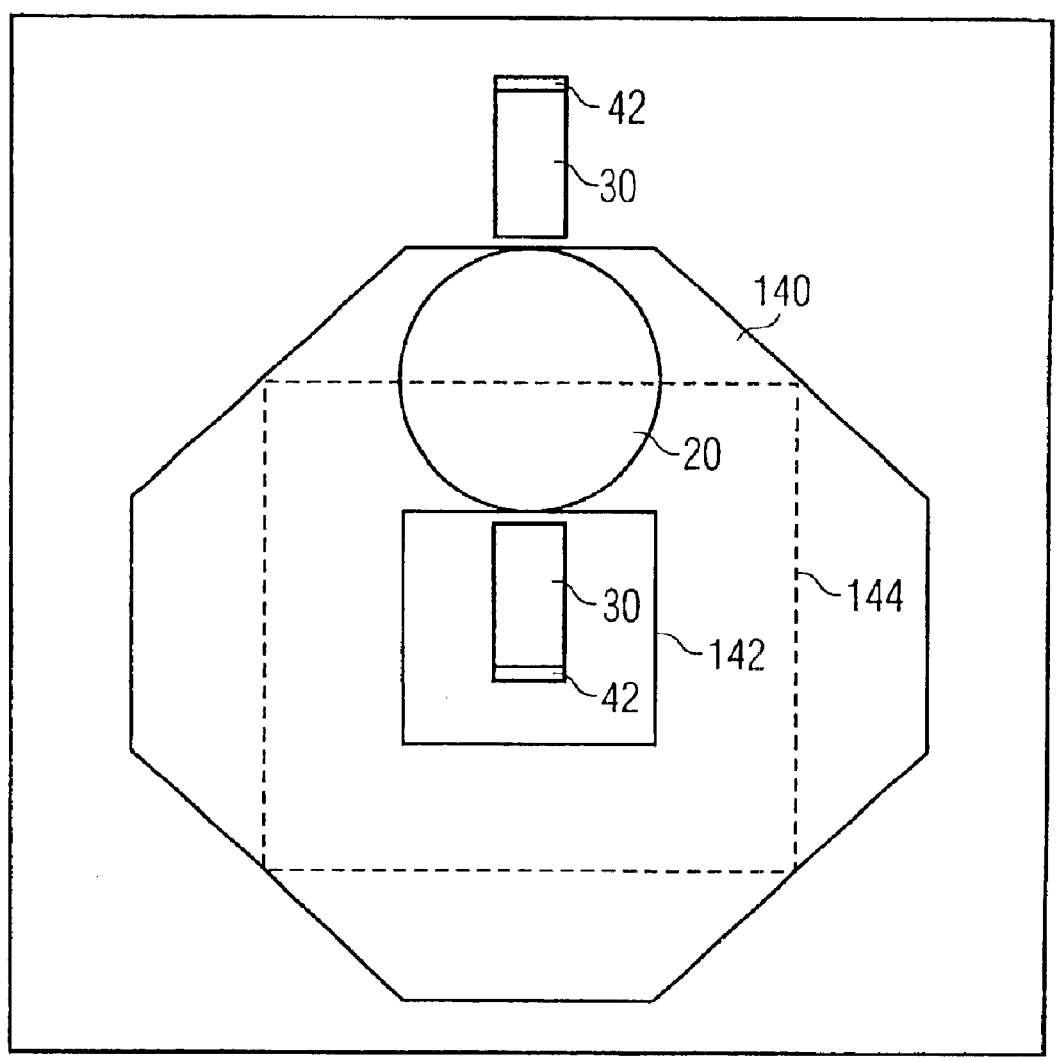
FIG. 9 is a diagrammatic, plan view of the semiconductor laser device with a ring laser as pumping radiation source according to a further exemplary embodiment of the invention.

In the exemplary embodiment of the invention that is illustrated in FIG. 9, the pumping radiation source for the semiconductor laser device is configured as a ring laser. In this case, the sequence of the semiconductor layers corresponds to the exemplary embodiment shown in FIGS. 2 and 4. In the plan view, a pumping ring laser 140 has an octagonal form with four-fold rotational symmetry and also a square central cutout 142. The pumped vertical emitter 20, which is circular in the plan view of FIG. 9, is disposed completely within the octagonal ring thus formed. The octagonal ring forms a ring resonator in the form of a closed waveguide exhibiting total reflection. During operation, cyclically circulating ring modes, only one of which is illustrated by way of example by reference symbol 144, build up oscillations in the waveguide. On account of the total reflection at the outer surfaces, the coupling-out losses are extremely low in this exemplary embodiment, so that the entire resonator-internal radiation field is advantageously available for pumping the vertical emitter 20.

Two strip lasers 30 are disposed at opposite locations of the vertical emitter 20, one of the strip lasers 30 lying in the cutout 142 of the octagonal ring. As described in detail for FIG. 1, the end mirrors 42 of the strip lasers 30 form a laser resonator for the opposite strip lasers 30 taken together.

The structures described above can be used not only in the InGaAlAs system used by way of example, but also, for example, in the InGaN, InGaAsP or InGaAlP system.

It goes without saying that the features of the invention that are disclosed in the description, in the drawings and in the claims may be essential both individually and in any possible combination for the realization of the invention.

We claim:

1. A surface-emitting semiconductor laser device, comprising:
    an optically pumpable vertical emitter having a radiation-generating layer;
    a pumping radiation source for optically pumping said optically pumpable vertical emitter; and
    at least one modulation radiation source for modulating an output power of the surface-emitting semiconductor laser device, said modulation radiation source having an edge-emitting semiconductor structure with a radiation-generating active layer, said modulation radiation source being disposed to emit, during operation, radiation, being coupled into said radiation-generating active layer of said optically pumpable vertical emitter, said modulation radiation source emitting radiation having a wavelength corresponding to a wavelength of radiation generated by said vertical emitter in such a way for reducing a population inversion generated by said pumping radiation source in said vertical emitter.

2. The semiconductor laser device according to claim 1, wherein said radiation-generating layer of said optically pumpable vertical emitter and said radiation-generating layer of said edge-emitting semiconductor structure of said modulation radiation source have at least one of equivalent structures, equivalent construction and formed from equivalent materials.

3. The semiconductor laser device according to claim 1, wherein modulation radiation emitted by said modulation radiation source has an energy precisely corresponding to an energy gap in said active layer of said vertical emitter.

4. The semiconductor laser device according to claim 1, further comprising a common substrate, said edge-emitting semiconductor structure of said modulation radiation source and said optically pumpable vertical emitter are disposed on said common substrate.

5. The semiconductor laser device according to claim 1, further comprising a common substrate, said edge-emitting semiconductor structure of said modulation radiation source and said optically pumpable vertical emitter are grown epitaxially on said common substrate, said common substrate being one of thinned and completely removed after an epitaxy process.

6. The semiconductor laser device according to claim 4, wherein said common substrate is transmissive for radiation generated by said optically pumpable vertical emitter.

7. The semiconductor laser device according to claim 1, wherein said radiation-generating active layer of said edge-emitting semiconductor structure of said modulation radiation source and said radiation-generating active layer of said optically pumpable vertical emitter are disposed next to one another in such a way that during operation said modulation radiation source radiates laterally into said radiation-generating active layer of said optically pumpable vertical emitter.

8. The semiconductor laser device according to claim 1, wherein said modulation radiation source is one of a plurality of modulation radiation sources disposed around said optically pumpable vertical emitter and each of said modulation radiation sources radiates into said radiation-generating active layer of said optically pumpable vertical emitter during operation.

9. The semiconductor laser device according to claim 8, wherein two of said modulation radiation sources are disposed on mutually opposite sides of said optically pumpable vertical emitter and together form a laser structure for modulating said output power of the semiconductor laser device.

10. The semiconductor laser device according to claim 1, further comprising:
   a first waveguide layer; and
   a second waveguide layer, said radiation-generating active layer of said edge-emitting semiconductor structure of said modulation radiation source is disposed between said first waveguide layer and said second waveguide layer.

11. The semiconductor laser device according to claim 10, further comprising:
   a first cladding layer;
   a second cladding layer, said radiation-generating active layer of said edge-emitting semiconductor structure of said modulation radiation source is disposed between said first cladding layer and said second cladding layer.

12. The semiconductor laser device according to claim 10, further comprising:
   a first cladding layer; and
   a second cladding layer, said first and second waveguide layers of said modulation radiation source are disposed between said first cladding layer and said second cladding layer.

13. The semiconductor laser device according to claim 1, further comprising a common substrate, said pumping radiation source has an edge-emitting semiconductor structure with an active layer and is disposed with said optically pumpable vertical emitter on said common substrate.

14. The semiconductor laser device according to claim 13, wherein said common substrate is transmissive for radiation generated by said optically pumpable vertical emitter.

15. The semiconductor laser device according to claim 13, further comprising:
   a first waveguide layer; and
   a second waveguide layer, said active layer of said edge-emitting semiconductor structure of said pumping radiation source is disposed between said first waveguide layer and said second waveguide layer.

16. The semiconductor laser device according to claim 15, wherein one of said first and second waveguide layers is disposed between said radiation-generating active layer of said optically pumpable vertical emitter and said active layer of said edge-emitting semiconductor structure of said pumping radiation source, and said radiation-generating active layer of said optically pumpable vertical emitter is optically coupled to said edge-emitting semiconductor structure of said pumping radiation source, so that radiation emitted by said pumping radiation source during operation is at least partially guided into said radiation-generating active layer of said optically pumpable vertical emitter.

17. The semiconductor laser device according to claim 13, wherein said active layer of said edge-emitting semiconductor structure of said pumping radiation source and said radiation-generating active layer of said optically pumpable vertical emitter are disposed next to one another in such a way that during operation said pumping radiation source radiates laterally into said radiation-generating active layer of said optically pumpable vertical emitter.

18. The semiconductor laser device according to claim 13, wherein said active layer of the edge-emitting semiconductor structure of said pumping radiation source and said radiation-generating active layer of said optically pumpable vertical emitter are disposed vertically offset with respect to one another, and said radiation-generating active layer of said optically pumpable vertical emitter is optically coupled to said edge-emitting semiconductor structure of said pumping radiation source, so that radiation emitted by said pumping radiation source during .operation is at least partially guided into said radiation-generating active layer of said optically pumpable vertical emitter.

19. The semiconductor laser device according to claim 13, wherein said edge-emitting semiconductor structure of said pumping radiation source with said active layer being different from said radiation-generating active layer of said optically pumpable vertical emitter.

20. The semiconductor laser device according to claim 19, wherein said active layer of said pumping radiation source emits at a shorter wavelength than said radiation-generating active layer of said optically pumpable vertical emitter.

21. The semiconductor laser device according to claim 13, further comprising:
   a first cladding layer; and
   a second cladding layer, said active layer of said edge-emitting semiconductor structure of said pumping radiation source are disposed between said first cladding layer and said second cladding layer.

22. The semiconductor laser device according to claim 13, wherein said active layer of said edge-emitting semiconductor structure of said pumping radiation source and said radiation-generating active layer of said optically pumpable vertical emitter are disposed next to one another in such a way that during operation said pumping radiation source radiates laterally and parallel to a layer plane of said radiation-geneating active layer of said optically pumpable vertical emitter, into said radiation-generating active layer of said optically pumpable vertical emitter.

23. The semiconductor laser device according to claim 13, further comprising:
   a first cladding layer; and
   a second cladding layer, said first and second waveguide layers of the pumping radiation source are disposed between said first cladding layer and said second cladding layer.

24. The semiconductor laser device according to claim 1, further comprising a common substrate, said pumping radiation source has an edge-emitting semiconductor structure with an active layer grown epitaxially with said optically pumpable vertical emitter on said common substrate, said common substrate being one of thinned and completely removed after an epitaxy process.

25. The semiconductor laser device according to claim 24, wherein said common substrate is transmissive for radiation generated by said optically pumpable vertical emitter.

26. The semiconductor laser device according to claim 1, wherein said pumping radiation source is one of a plurality of pumping radiation sources disposed around said optically pumpable vertical emitter and optically pumping said radiation-generating active layer of said optically pumpable vertical emitter during operation.

27. The semiconductor laser device according to claim 26, wherein said plurality of pumping radiation sources is two pumping radiation sources disposed on mutually opposite sides of said optically pumpable vertical emitter and together form a laser structure for optically pumping said optically pumpable vertical emitter.

28. The semiconductor laser device according to claim 1, wherein said pumping radiation source has at least one ring laser with a resonator, said radiation-generating active layer of said optically pumpable vertical emitter disposed within said resonator of said ring laser.

29. The semiconductor laser device according to claim 28, wherein said resonator of said ring laser is formed by an annularly closed waveguide.

30. The semiconductor laser device according to claim 1,
wherein said optically pumpable vertical emitter has a resonator; and
further comprising a resonator mirror layer delimiting said resonator.

31. The semiconductor laser device according to claim 30, wherein said resonator mirror layer is a Bragg reflector.

32. The semiconductor laser device according to claim 30, further comprising a further resonator mirror layer delimiting said resonator, said radiation-generating active layer of said optically pumpable vertical emitter disposed between said resonator mirror layer and said further resonator mirror layer.

33. The semiconductor laser device according to claim 30, further comprising an element for frequency conversion disposed on said resonator of said optically pumpable vertical emitter.

34. The semiconductor laser device according to claim 33, wherein said element for frequency conversion is a frequency doubler.

35. The semiconductor laser device according to claim 30, wherein said resonator mirror layer is a distributed Bragg reflector.

36. The semiconductor laser device according to claim 1, wherein said optically pumpable vertical emitter has a resonator delimited by an external mirror.

37. The semiconductor laser device according to claim 1, wherein the semiconductor laser device is configured for an output power greater than or equal to 100 mW.

38. The semiconductor laser device according to claim 1, wherein at least one of said optically pumpable vertical emitter, said modulation radiation source, and said pumping radiation source is formed from a material selected from the group consisting of InAlGaAs, InAlGaN, InGaAsP and InGaAlP.

39. The semiconductor laser device according to claim 38, wherein at least one of said optically pumpable vertical emitter, said modulation radiation source, and said pumping radiation source contain at least one compound selected from the group consisting of $In_xAl_yGa_{1-x-y}As$, $In_xAl_yGa_{1-x-y}N$, $In_xGa_{1-x}As_zP_{1-z}$ and $In_xGa_yAl_{1-x-y}P$, where $0 \leq x \leq 1, 0 \leq y \leq 1, 0 \leq z \leq 1$ and $0 \leq x+y \leq 1$ holds true for each of the compounds.

40. The semiconductor laser device according to claim 1, wherein said radiation-generating active layer of said edge-emitting semiconductor structure of said modulation radiation source and said radiation-generating active layer of said optically pumpable vertical emitter are disposed next to one another in such a way that during operation said modulation radiation source radiates laterally and parallel to a layer plane of said radiation-generating active layer of said optically pumpable vertical emitter into said radiation-generating active layer of said optically pumpable vertical emitter.

41. The semiconductor laser device according to claim 1, wherein the semiconductor laser device is configured for an output power greater than or equal to 200 mW.

42. The semiconductor laser device according to claim 1, wherein the semiconductor laser device is configured for an output power greater than or equal to 500 mW.

* * * * *